United States Patent
Adam et al.

(10) Patent No.: US 7,557,672 B1
(45) Date of Patent: Jul. 7, 2009

(54) FREQUENCY SELECTIVE LIMITING WITH RESONATORS

(75) Inventors: John Douglas Adam, Millersville, MD (US); James Edward Baumgardner, Ellicott City, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 213 days.

(21) Appl. No.: 11/634,841

(22) Filed: Dec. 7, 2006

(51) Int. Cl.
*H03G 11/00* (2006.01)
*H03K 5/08* (2006.01)

(52) U.S. Cl. .................. 333/17.2; 327/309
(58) Field of Classification Search ............ 333/17.2, 333/24.1–24.3, 1.1, 175; 327/325, 309
See application file for complete search history.

(56) References Cited

U.S. PATENT DOCUMENTS

| | | | |
|---|---|---|---|
| 4,396,893 A * | 8/1983 | Edson | ............... 333/17.2 |
| 4,845,439 A | 7/1989 | Stitzer et al. | |
| 4,944,857 A | 7/1990 | Adam | |
| 4,970,775 A | 11/1990 | Brown et al. | |
| 4,980,657 A | 12/1990 | Stitzer et al. | |
| 5,023,573 A | 6/1991 | Adam | |
| 5,157,360 A | 10/1992 | McGann et al. | |
| 5,170,137 A | 12/1992 | Woermbke et al. | |
| 5,185,588 A | 2/1993 | McGann et al. | |
| 6,998,929 B1 | 2/2006 | Adam | |

OTHER PUBLICATIONS

Giarola, Attilio J., "A review of the theory, characteristics, and operation of frequency selective limiters", Proc. of the IEEE, vol. 67, No. 10, Oct. 1979, pp. 1380-1396.
Littlepage, Robert S., "The impact of interference on civil GPS", Northrop Grumman Corporation, undated.
Adam, J. Douglas, et al., "Frequency selective limiters for high dynamic range microwave receivers", IEEE Transactions on microwave theory & techniques, vol. 41, No. 12., Dec. 1993, pp. 2227-2231.
Nomoto, Toshihiro, et al., "A signal-to-noise enhancer using two MSSW filters and its applications to noise reduction in DBS reception", IEEE Transactions on microwave theory & techniques, vol. 41, No. 8, Aug. 1993, pp. 1316-1322.

* cited by examiner

*Primary Examiner*—Daniel D Chang
(74) *Attorney, Agent, or Firm*—Sean Wooden; Andrews Kurth LLP

(57) ABSTRACT

A frequency selective limiter includes a pair of back-to-back diodes, coupled to an input and an output of the frequency selective limiter, and a resonator. The resonator is coupled to the pair of back-to-back diodes.

24 Claims, 5 Drawing Sheets

FREQUENCY SELECTIVE LIMITING WITH RESONATORS

The invention was made under a contract with an agency of the United States Government, contract number F306020-21-C-0016.

FIELD OF THE INVENTION

The invention relates to signal processing devices, specifically to a frequency selective limiter.

BACKGROUND OF THE INVENTION

In a radio frequency (RF) environment, interference signals may have jamming effects on an RF receiving system. Jamming interference signals may originate, for example, in a laptop computer on an airplane, a radio or television tower, or any high frequency device such as radar, a radio or cellular telephone. Also jamming signals may be generated by individuals, such as a combatant in a military or other environment.

Frequency selective limiters (FSLs), also known as power selective limiters (PSLs), are used for suppressing RF signals in various types of equipment having a need for protection against interference and jamming signals. FSLs are attenuating devices that may attenuate higher power level signals, such as interference and jamming signals, while simultaneously allowing lower power level signals separated by only a small frequency offset from the higher level signals to pass with relatively low loss.

FSLs have particular applicability in RF systems used, for example, for navigational purposes and, more particularly, to receivers which operate in satellite navigation systems such as the well known Global Positioning System (GPS). For example, FSLs can be used in electronic warfare systems ahead of a Bragg cell or a compressive receiver, or other broadband receiver technology, with modest dynamic range, to limit the input signal power so that the receiver is operated in a linear manner. Non-linearities in broadband receivers can cause inter-modulation between multiple input frequencies that produce spurious signals, which can obscure the signals of interest. Stripline FSLs fabricated with yttrium iron garnet (YIG) films have been developed for this application and rely on the non-linear excitation of spin waves in the YIG film to achieve the desired frequency selective limiting behavior. FSLs have also been proposed to improve the "anti-jam" performance of GPS receivers and improve the signal to noise ratio of satellite TV receivers. Thus, FSLs are used to eliminate unwanted interference or jamming signals.

SUMMARY OF THE INVENTION

A frequency selective limiter includes a pair of back-to-back diodes, coupled to an input and an output of the frequency selective limiter, and a resonator. The resonator is coupled to the pair of back-to-back diodes.

DETAILED DESCRIPTION

Figure 1:
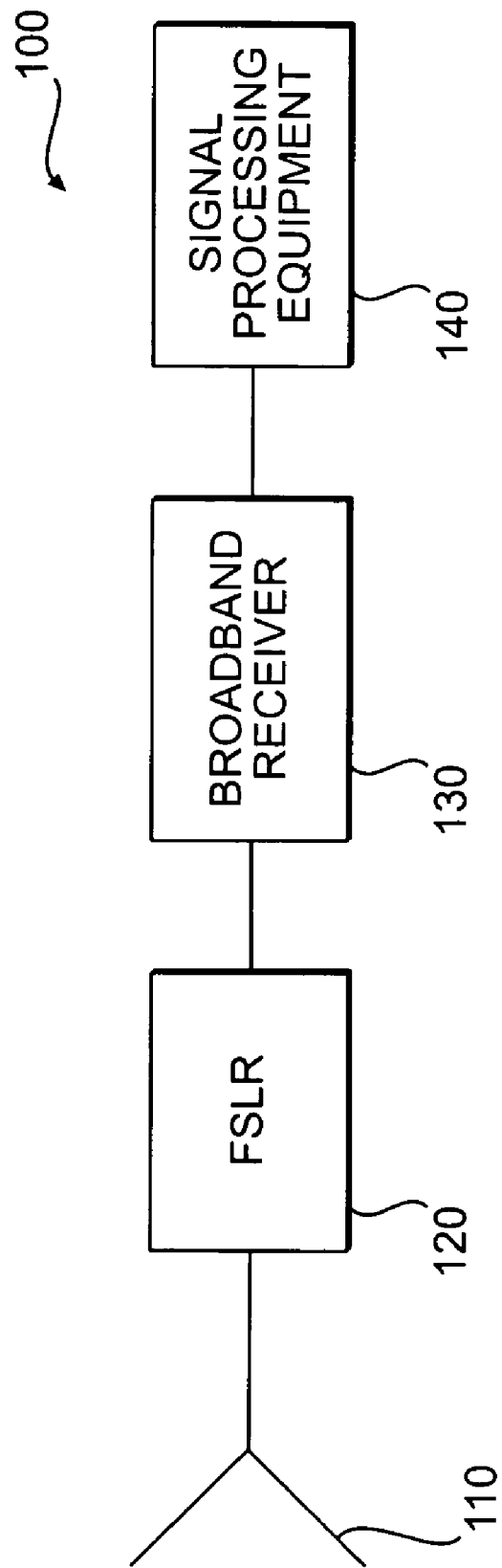
FIG. 1 is a diagrammatic representation of a radio-frequency receiver system incorporating an embodiment of the invention.

FIG. 1 is diagrammatic representation of a radio-frequency receiver system 100 that may incorporate an embodiment of the present invention. As shown in FIG. 1, system 100 includes an antenna 110 for collecting and passing signals to a broadband-type receiver 130. The system 100 may also include a transmitter or transceiver (omitted). The system 100 also includes a frequency selective limiter with resonator (FSLR) 120 interposed between antenna 110 and broadband-type receiver 130.

The received signals measured by the broadband receiver 130 may thereafter be supplied to signal processing equipment 140, such as a processor and/or other suitable device. The FSLR 120 may increase the dynamic range over which signals collected by antenna 110 can be measured by broadband-type receiver 130. FSLR 120 may selectively attenuate certain signals while allowing other signals to pass. For example, FSLR 120 may permit signals at or above a predetermined threshold value to pass to the broadband receiver 130. The FSLR 120 may attenuate the other signals. Moreover, of the signals that are at or above the threshold value, for example, the FSLR 120 may attenuate only those signals that are on-resonance with respect to the FSLR 120 (e.g., frequency of the received signal matches or is within a predetermined range of the frequency of the resonator). Received signals, at or above the threshold value, that are off-resonance with respect to the FSLR 120 (e.g., frequency of the received signal does not match or is outside a predetermined range of the frequency of the resonator), will not be attenuated but will be allowed to pass to the broadband receiver 130. Thus, the non-attenuated signals may be processed by the signal processing equipment 140.

The predetermined threshold values of the signals as well as the on-resonance and off-resonance frequency values of the FSLR, as described herein, are variable. Moreover, whether a signal value is at, above and/or below a predetermined threshold value, before it is sent to the broadband receiver 130, can be changed as desired.

Figure 2:
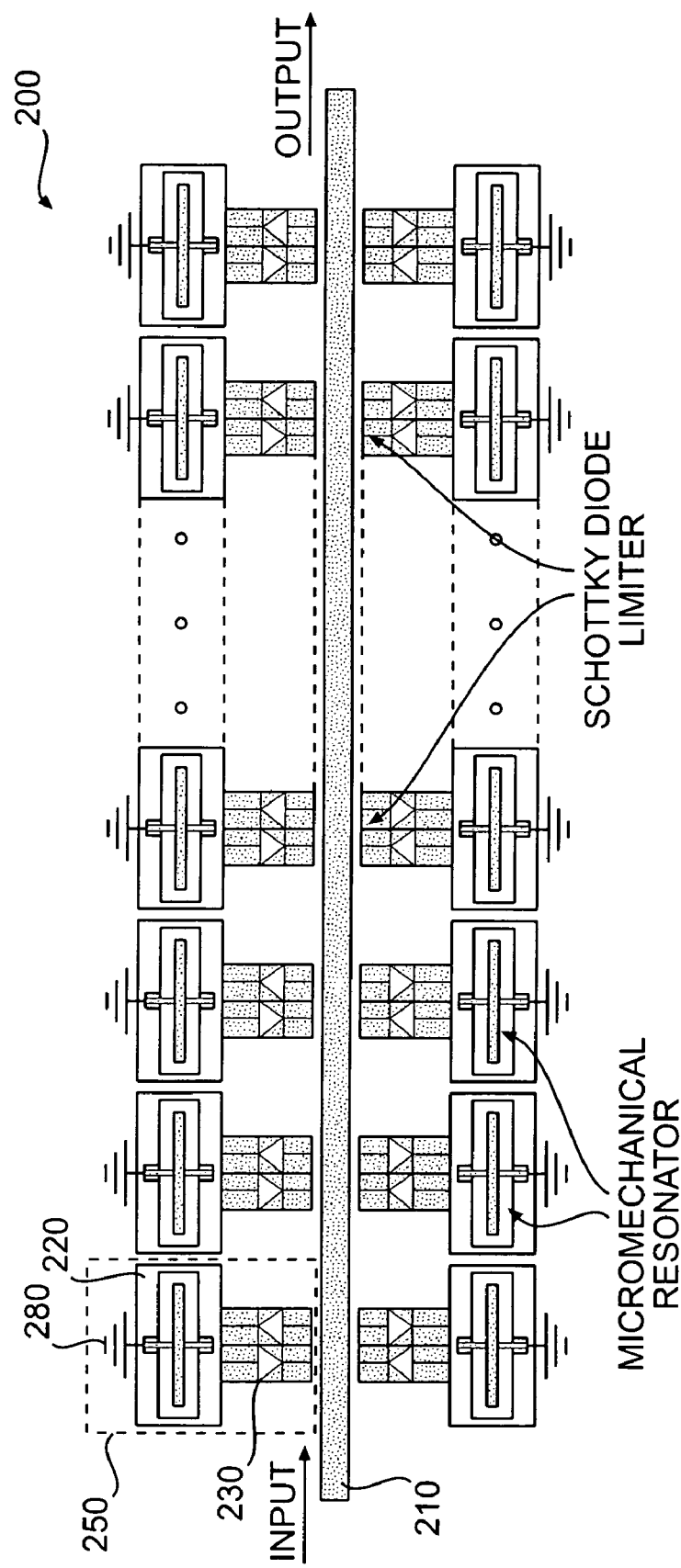
FIG. 2 is a diagrammatic representation of a resonator based frequency selective limiter system in accordance with an embodiment of the invention.

FIG. 2 shows a frequency selective limiter with resonator (FSLR) system 200 in accordance with an embodiment. As shown, the FSLR system 200 includes one or more resonators 220. The resonators 220 may be any type of resonators, such as miniature micro-mechanical resonators, transmission line resonators, film bulk acoustic wave resonators (FBAR), lumped element L-C resonators, superconducting resonators, and surface acoustic wave (SAW) resonators or any other type of resonators. Transmission line resonators include, for example, dielectric resonators, waveguide resonators, microstrip resonators, stripline resonators, slot-line resonators and coplanar waveguide resonators. The micro-mechanical resonators may be, for example, silicon based resonators or diamond based resonators. For example, micromechanical resonators include electrostatically actuated polysilicon or poly diamond beam, wine glass and radial mode resonators, and piezoelectrically actuated beam, wineglass and radial mode resonators fabricated with Zinc Oxide (ZnO), Aluminum Nitride (AlN) or Lead Zirconate Titanate (PZT) thin film materials.

The resonators 220 used in the system 200 may have high Q performance values, which is required to provide adequate frequency selectivity in the attenuating or limiting process. High Q provides good selectivity but requires a large number of resonators to provide continuous coverage over the desired bandwidth. The number of resonators can be reduced if the resonators have lower Q, but then the selectivity of the limiting process is degraded and the characteristics of small adjacent signals can be modified by the large signal being limited. Interaction between the large signals and adjacent small signals is undesirable for an effective FSL.

As shown, the resonator 220 is coupled to a back-to-back pair of diodes 230, that may limit or attenuate the received input signals. The resonator 220 may also be coupled to ground 280 as shown. The back-to-back pair of diodes 230 are coupled to transmission line 210. The resonator 220 and the pair of diodes 230 collectively represent a frequency selective limiter with resonator (FSLR) 250. One or more of the FSLRs 250 may be coupled the transmission line 220 to form a FSLR system 200, as shown.

In the system 200, each resonator 220 may be tuned to a different frequency so that the complete frequency band included. The size of the system 200 may depend on the frequency the resonator 220 is tuned to. For example, at 2.75 MHz center frequency, the resonators 220 are approximately 1 mm long and the resonator spacing is compatible with the diode pairs 230. However, as the frequency is increased and the resonator 220 length decreases proportionally, the space available for the diode pairs 230 will decrease. In an embodiment, the system 200 may be formed on a single chip. Thus, to minimize the size of the system 200 chip, integration of the diodes 230 and the resonators 220 onto the same substrate will be desired.

On-chip integration is desirable at microwave frequencies where the resonators are micron sized or smaller. However, hybrid arrangements are also possible where the limiter diodes and the resonators are on separate substrates that are placed side-by-side or on top of each other and are connected, for example, by bump or wire bonds. It is also possible to define the resonators on a common substrate and surface mount each diode onto the substrate. In some cases, discrete resonators and diodes may be mounted onto a substrate or circuit board.

In operation, the system 200 receives input signals on transmission line 210. As the input signals are received at the transmission line 210, signals having an amplitude that is, for example, greater than or equal to a threshold value of the diodes 230 will cause the diodes to operate or turn "on." As the diodes 230 are turned on based on the amplitude of the input signals, those diodes will act as a short permitting the signal to pass to their respective resonators 220. Signals passed to the resonators 220 having frequencies matching the frequencies of the resonators 220 are reflected back to the input. On the other hand, signals with an amplitude at or greater than the threshold value but with frequencies that are less than or greater than the frequencies of the resonators are not reflected back to the input but are passed to the output via the transmission line 210. In other words, on resonance frequencies are attenuated, while off resonance frequencies are not attenuated. The threshold values, such as for frequency and/or amplitude, may be a predetermined values or may be determined dynamically based on various parameters. The threshold values may be the same or may be different for the various resonators and/or diodes.

The various resonators 220 may be tuned to different frequencies, thus only those frequencies that the resonators 220 are not tuned to are allowed to pass to the output, while frequencies that the resonators 220 are tuned to will be reflected back to the input if the amplitude of the signal is greater than or less than the threshold value, for example. If the signal's amplitude is, for example, lower than the threshold value, then the diodes 230 will not operate, acting as an open, causing the signal to be passed to the output, via transmission line 210. Thus, if the signal's amplitude is, for example, lower than a threshold value, it will pass directly to the output, without passing to the resonators 220. Thus, each FSLR 250 may determine which frequency and/or the amplitude of the signal that will be allowed to pass to the output as well as those that will be suppressed or attenuated, based on the type and design of the resonator 220 and/or the back-to-back pair of diodes 230. In one embodiment, the diode pairs 230 may have the same threshold operation value or, in another embodiment, the diode pairs 230 may have different threshold operational values. Therefore, system 200 may attenuate signals that are at or above a predetermined threshold value.

In an alternative embodiment, diodes or resonators can attenuate signals that are lower or higher than a predetermined threshold value.

The resonators 220 can be any type of resonators as described above.

The diodes 230 can be any type of diodes, such as Schottky diodes, point contact diodes, tunnel diodes, or Positive-Intrinsic-Negative (PIN) diodes, made from any type of semiconducting material such as Silicon, Gallium Arsenide, Gallium Nitride, Silicon Carbide, Silicon-Germanium or Germanium. Schottky diodes may be used because these type of diodes have very sharp threshold voltages, have low parallel capacitances and can operate at higher frequencies. High capacitances may interfere with the resonators.

Figure 3:
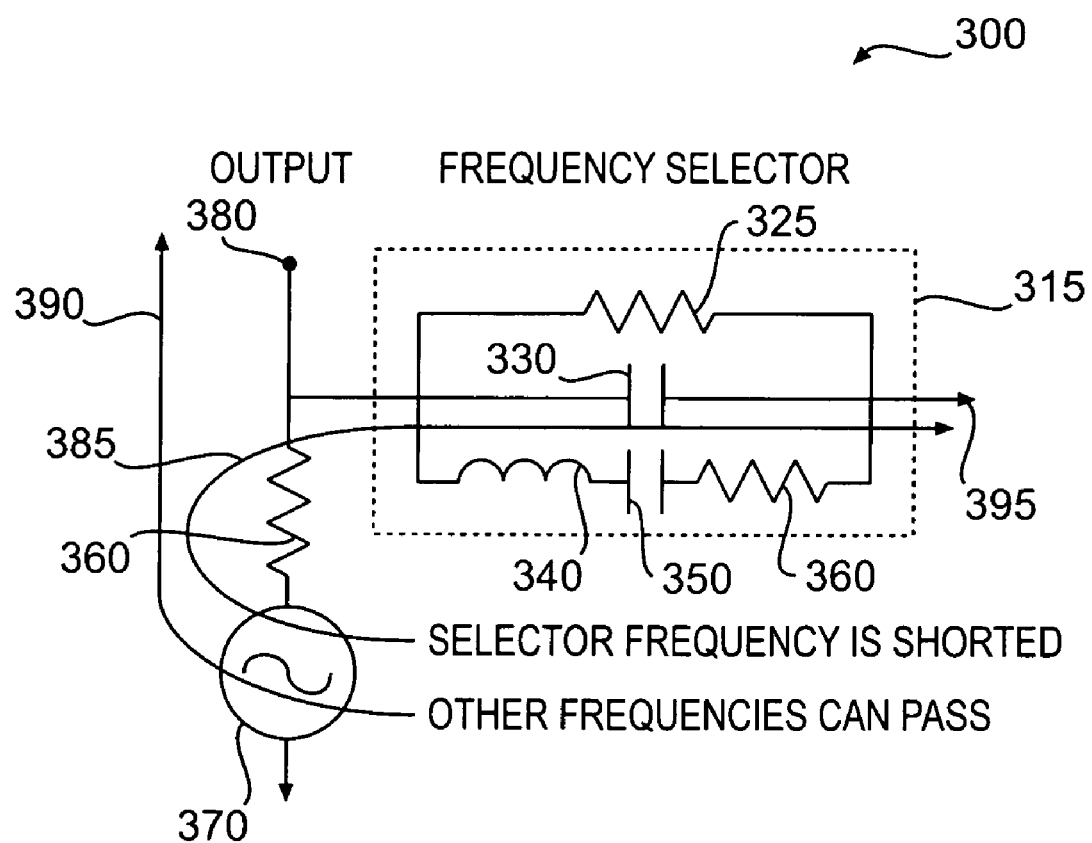
FIG. 3 illustrates an RLC model of a resonator in accordance with an embodiment of the invention.

FIG. 3 illustrates a resonator, using RLC (resistor (R), inductor (I), capacitor (C)) modeling, in accordance with an embodiment. The RLC model is represented as a band-stop filter configuration. FIG. 3 shows an input voltage source 370 coupled to a frequency selector or resonator 315 via resistor 360. As shown, the resonator 315 is modeled by the RLC circuit. The resonator 315 may be a micro-mechanical resonator. The modeled RLC resonator 315 includes a parasitic parallel resistance (Rp) 325 and a parasitic parallel capacitance (Cp) 330. The resonator 315 also includes series resistor (Rs) 360, series inductor (Ls) 340 and series capacitor (Cs) 350.

The input voltage source 370 may generate an input signal at a particular frequency. The signal passes through resistor 360, which represents the impedance of the transmission line. If the generated signal is at a frequency near the on-resonance frequency or band frequency of modeled resonator 315, the resonator 315 acts as a short circuit (i.e., low impedance) and the input signal 385 is deviated away from the output 380 and shorted to ground 395. In other words, if the frequency of input signal 385 matches the resonant frequency of the resonator 315, then the input signal 385 is not provided to the output 380 but is attenuated. If, on the other hand, the generated signal is at an off-resonance frequency of resonator 315, the resonator 315 acts as an open circuit (i.e., high impedance) and the input signal 390 is provided to output 380. In other words, if the frequency of input signal 390 does not match the resonant frequency of the resonator 315, the input signal 390 cannot pass to ground 395 but is provided to the output 380. Thus, if the signal is off-resonance, the signal (e.g., signal 390) is not attenuated but is provided to the output 380, as shown.

Figure 4:
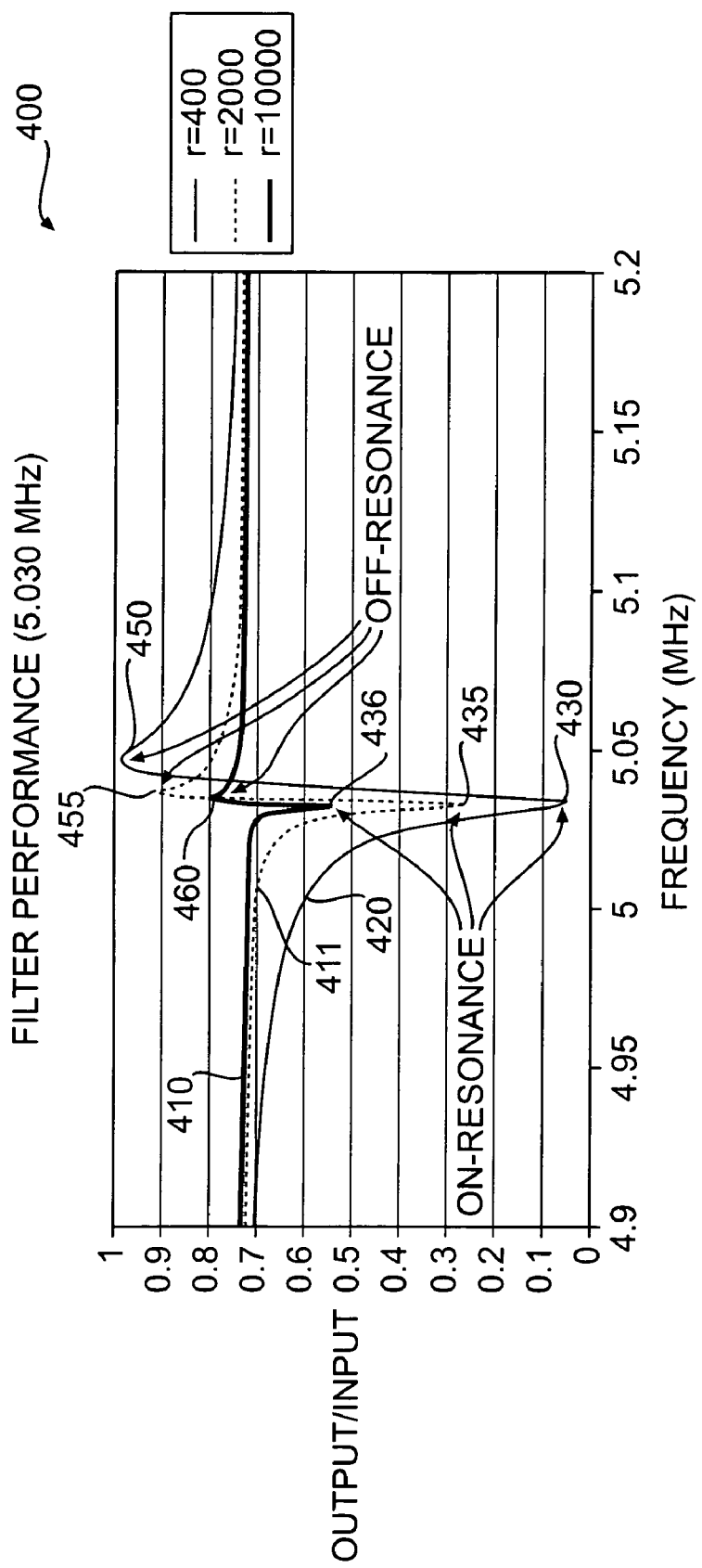
FIG. 4 is a graph showing the output response of the resonator.

FIG. 4 is a graph showing the performance of a micromechanical resonator, such as the RLC modeled resonator 315 shown in FIG. 3. The graph shows the ratio of the Output over the Input (Output/Input), on the Y-Axis, versus the Frequency, on the X-Axis. The output response of a resonator has two primary features, a resonance response (i.e., on-resonance) that is determined by the series inductance Ls and series capacitance Cs (e.g., inductance 340 and capacitance 350), and an off-resonance response that is determined by the ratio (r) of the parasitic capacitance Cp and the series capacitance Cs (i.e., r=Cp/Cs). The value of r is a material parameter, closely related to the piezoelectric coupling, k, where $1/k^2=1+8r/\pi^2$. Thus, referring to FIG. 3, the off-resonance response of resonator is determined based on the ratio of the parasitic capacitance 330 and the series capacitance 350. An ideal band-stop filter completely eliminates in-band signals, thus, the smallest value of r (i.e., the greatest value of k) is desirable.

Referring to graph 400, when r=10,000, the output response of the resonator is shown by curve 410. The on-resonance output response 436 of such a resonator is approximately 0.55 (i.e., output/input). In other words, even where the frequency of the output matches the frequency of the resonator, where the value of r=10,000, approximately 50% of the input is still measured at the output. At the off-resonance frequency, where r=10,000, the off-resonance output response 460 of such a resonator is approximately 0.8 (i.e., output/input). In other words, even where the frequency of the output does not match the frequency of the resonator, only 80% of the input is measured at the output. Thus, a resonator made with material where r is a high value will not provide an efficient output response.

As the value of r decreases (e.g., r=2000), the on-resonance output response 435 of such a resonator is approximately 0.26 (i.e., output/input). In other words, where the frequency of the output matches the frequency of the resonator, where r=2000, approximately 26% of the input is still measured at the output. At the off-resonance frequency, where r=2,000, the off-resonance output response 455 of such a resonator is approximately 0.92 (i.e., output/input). In other words, where the frequency of the output does not match the frequency of the resonator, as much as 90% of the input is measured at the output.

As the value of r decreases even further (e.g., r=400), the on-resonance output response 430 of such a resonator is approximately 0.05 (i.e., output/input). In other words, where the frequency of the output matches the frequency of the resonator, where r=400, only 5% of the input is still measured at the output. At the off-resonance frequency, where r=400, the off-resonance output response 450 of such a resonator is approximately 0.98 (i.e., output/input). In other words, where the frequency of the output does not match the frequency of the resonator, almost 98% of the input is measured at the output. Thus, the smaller the r value, the better the output performance of the resonator.

The value of r obtained in experimental data varies greatly with the material and geometry. Micromechanical resonators built from quartz show values of r greater than 3000; while those built from Aluminum Gallium Arsenide (AlGaAs) show r between 2000 and 4000; those built from ZnO show r between 500 and 1500; and those built from AlN show r between 100 and 600. FBAR resonators have even smaller values of r. For example, AlN and ZnO FBAR resonators yield values of r from 15 to 20, PZT FBAR resonators have shown r values as low as 2-5.

Figure 5:
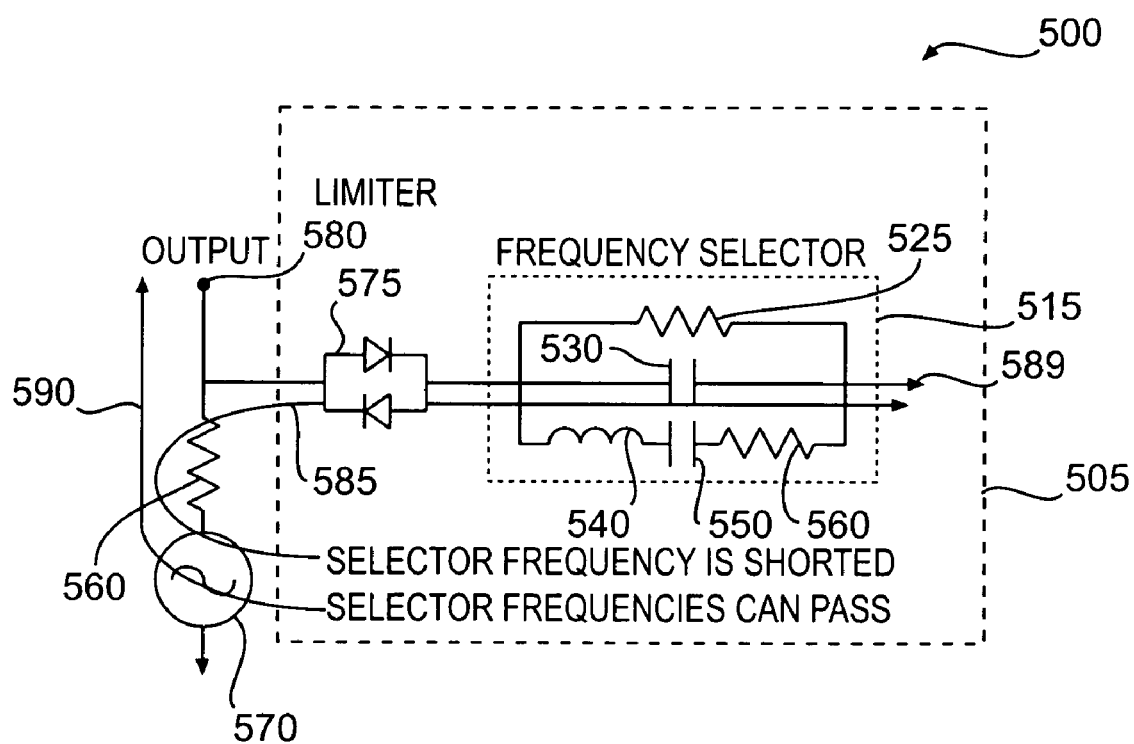
FIG. 5 is a diagrammatic representation of a frequency selective limiter incorporating a resonator in accordance with an embodiment of the invention.

FIG. 5 shows a frequency selective limiter with resonator (FSLR) 505 in accordance with an embodiment of the invention. FSLR 505 is incorporated in circuit 500, as shown in FIG. 5. FIG. 5 shows an input voltage source 570 coupled to FSLR 505 via resistor 360. As shown, FSLR 505 is modeled by the RLC circuit. FSLR 505 includes a pair of back-to-back diodes 575 coupled to a frequency selector or resonator 515. The resonator 505 may be a micro-mechanical resonator or other types of resonators as described above. The pair of back-to-back diodes 575 may be Schottky diodes or other types of diodes as described above. The modeled RLC resonator 515 includes a parasitic parallel resistance (Rp) 525 and a parasitic parallel capacitance (Cp) 530. The resonator 515 also includes series resistor (Rs) 560, series inductor (Ls) 540 and series capacitor (Cs) 550. The resonator 515 may be similar to the resonator 315 and may exhibit the similar operational characteristics as resonator 315, as shown in the figures and described above.

In accordance with an embodiment, the input voltage source 570 generates an input signal at a particular frequency and amplitude. The signal passes through resistor 560 and is received at FSLR 505. The input signal is received by the pair of back-to-back diodes 575, of FSLR 505, and if the received signal has an amplitude (or a signal value) that is, for example, less than or equal to a threshold value of the diodes 575, then the diodes 575 will not operate (i.e., will remain in an "off" state), appearing as a "open" to the input signal. The "open" condition of the diodes 575 presents an high impedance path, causing the input signal 590 to be diverted to the output 580. The input signal 590 with, for example, an amplitude that is less than or equal a threshold value for the diodes 575 will not pass through the diodes, and to resonator 515, regardless of the frequency of the input signal. Thus, the input signal 575 passes trough and is not attenuated by FSLR 505.

If, on the other hand, the signal generated by input voltage source 570 has an amplitude that is, for example, greater than or equal to a threshold value of the diodes 575, then the diodes will operate (i.e., will turn "on") and appear as a short to the input signal, causing the input signal 585 to be diverted away from the output 580 and input to the resonator 515.

As the diode pair 575 is turned on based on the amplitude of the input signals, described above, the diode pair 575 will act as a short permitting the signal to pass to the resonator circuit 515. If the signal passed to the resonator 515 is on-resonance, that on-resonance signal 585 is not provided to output 580, but is attenuated by the FSLR 505. On the other hand, if the signal off-resonance, that off-resonance signal 590 is passed to the output 580. Thus, even if a signal is at the threshold amplitude of the diode pair 575, the signal will not be attenuated unless the frequency of the signal matches that of the resonance frequency of the resonator 515.

The FSLR 505 described above may be utilized in the FSLR system 200, shown in FIG. 2 and described above, and operates as described herein.

In one embodiment, multiple frequency selective limiters, as tuned to different frequencies and connected to a common transmission line enable operation over a wide bandwidth.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A frequency selective limiter comprising:
    a pair of back-to-back diodes coupled to an input and an output of the frequency selective limiter; and
    a resonator coupled to the pair of back-to-back diodes wherein if an amplitude of an input signal is greater than or equal to a threshold value associated with the pair of back-to-back diodes, the input signal is passed to the resonator through the pair of back-to-back diodes.

2. The frequency selective limiter of claim 1, wherein the pair of back-to-back diodes comprise Schottky diodes.

3. The frequency selective limiter of claim 1, wherein the resonator is a micro-mechanical resonator.

4. The frequency selective limiter of claim 1, wherein if the input signal passed to the resonator is on-resonance, then the input signal is not passed to the output of the frequency selective limiter.

5. The frequency selective limiter of claim 1, wherein if the input signal passed to the resonator is off-resonance, then the input signal is passed to the output of the frequency selective limiter.

6. The frequency selective limiter of claim 1, further comprising:
a transmission line, wherein the transmission line couples the pair of back-to-back diodes to the input and the output of the frequency selective limiter.

7. The frequency selective limiter of claim 1, further comprising:
a second pair of back-to-back diodes coupled to the input and the output of the frequency selective limiter.

8. The frequency selective limiter of claim 7, further comprising:
a second resonator coupled to the second pair of back-to-back diodes.

9. The frequency selective limiter of claim 8, wherein an on-resonance frequency of the first resonator is not equal to an on-resonance frequency of the second resonator.

10. A frequency selective limiter comprising:
a pair of back-to-back diodes coupled to an input and an output of the frequency selective limiter;
a resonator coupled to the pair of back-to-back diodes; and
a second pair of back-to-back diodes coupled to the input and the output of the frequency selective limiter.

11. The frequency selective limiter of claim 10, further comprising:
a second resonator coupled to the second pair of back-to-back diodes.

12. The frequency selective limiter of claim 11, wherein an on-resonance frequency of the first resonator is not equal to an on-resonance frequency of the second resonator.

13. The frequency selective limiter of claim 10, wherein the pair of back-to-back diodes comprise Schottky diodes.

14. The frequency selective limiter of claim 10, wherein the resonator is a micro-mechanical resonator.

15. The frequency selective limiter of claim 10, further comprising:
a transmission line, wherein the transmission line couples the pair of back-to-back diodes to the input and the output of the frequency selective limiter.

16. A frequency selective limiter comprising:
one or more pairs of back-to-back diodes coupled to an input and an output of the frequency selective limiter;
a resonator coupled to each pair of back-to-back diodes; and
a transmission line, wherein the transmission line couples each pair of back-to-back diodes to the input and the output of the frequency selective limiter and if an amplitude of an input signal is greater than or equal to a threshold value associated with each pair of back-to-back diodes, the input signal is passed to the resonator through the respective pair of back-to-back diodes.

17. The frequency selective limiter of claim 16, wherein the pair of back-to-back diodes comprise Schottky diodes.

18. The frequency selective limiter of claim 16, wherein the resonator is a micro-mechanical resonator.

19. A frequency selective limiter comprising:
one or more pairs of back-to-back diodes coupled to an input and an output of the frequency selective limiter;
a resonator coupled to each pair of back-to-back diodes; and
a transmission line, wherein the transmission line couples each pair of back-to-back diodes to the input and the output of the frequency selective limiter and each resonator coupled to each pair of back-to-back diodes is tuned to a different resonant frequency and if a frequency of the input signal passed to the resonator matches the resonant frequency of the corresponding resonator, then the input signal is not passed to the output of the frequency selective limiter.

20. The frequency selective limiter of claim 19 wherein the pair of back-to-back diodes comprise Schottky diodes.

21. A frequency selective limiter comprising:
one or more pairs of back-to-back diodes coupled to an input and an output of the frequency selective limiter;
a resonator coupled to each pair of back-to-back diodes; and
a transmission line, wherein the transmission line couples each pair of back-to-back diodes to the input and the output of the frequency selective limiter and each resonator coupled to each pair of back-to-back diodes is tuned to a different resonant frequency and if a frequency of the input signal passed to the resonator does not match the resonant frequency of the corresponding resonator, then the input signal is passed to the output of the frequency selective limiter.

22. The frequency selective limiter of claim 21 wherein the pair of back-to-back diodes comprise Schottky diodes.

23. The frequency selective limiter of claim 21, wherein the resonator is a micro-mechanical resonator.

24. The frequency selective limiter of claim 19, wherein the resonator is a micro-mechanical resonator.

* * * * *